United States Patent
Bovet et al.

(10) Patent No.: US 10,152,029 B2
(45) Date of Patent: Dec. 11, 2018

(54) METHOD FOR MANAGING OPERATIONS ON AN ELECTRONIC DEVICE

(71) Applicant: ETA SA MANUFACTURE HORLOGERE SUISSE, Grenchen (CH)

(72) Inventors: Jean-Luc Bovet, Solothurn (CH); Martin Jufer, Melchnau (CH); Andre Nussbaum, Bienne (CH); Laurent Christe, Bienne (CH)

(73) Assignee: ETA SA Manufacture Horlogère Suisse, Grenchen (CH)

( * ) Notice: Subject to any disclaimer, the term of this patent is extended or adjusted under 35 U.S.C. 154(b) by 0 days.

(21) Appl. No.: 14/786,354

(22) PCT Filed: Apr. 16, 2014

(86) PCT No.: PCT/EP2014/057772
§ 371 (c)(1),
(2) Date: Oct. 22, 2015

(87) PCT Pub. No.: WO2014/173766
PCT Pub. Date: Oct. 30, 2014

(65) Prior Publication Data
US 2016/0077497 A1   Mar. 17, 2016

(30) Foreign Application Priority Data

Apr. 23, 2013  (EP) ..................................... 13164968

(51) Int. Cl.
*G04G 21/08* (2010.01)
*G06F 3/044* (2006.01)
*H03K 17/96* (2006.01)

(52) U.S. Cl.
CPC ............. *G04G 21/08* (2013.01); *G06F 3/044* (2013.01); *H03K 17/9622* (2013.01)

(58) Field of Classification Search
CPC ... G06F 1/3203; G04G 21/08; H03K 17/9622
(Continued)

(56) References Cited

U.S. PATENT DOCUMENTS 7,946,758 B2 * 5/2011 Mooring .............. G04B 37/005
                                                    368/276
8,292,493 B2 * 10/2012 Mooring .............. G04B 37/005
                                                    368/276
(Continued)

OTHER PUBLICATIONS

International Search Report dated Apr. 10, 2015 for PCT/EP2014/057772 filed on Apr. 16, 2014.

*Primary Examiner* — Sean Kayes
(74) *Attorney, Agent, or Firm* — Oblon, McClelland, Maier & Neustadt, L.L.P.

(57) ABSTRACT

An electronic device including a case includes a glass and a back cover, the electronic device including at least one electronic module configured to calculate a current time, to execute plural functions and to provide information relating to the current time and to the functions to a display disposed underneath the glass. The electronic device further including a controller including at least one contact area allowing a user to act on the at least one electronic module, the at least one contact area being monitored by the electronic module at a scanning frequency.

16 Claims, 2 Drawing Sheets

(58) Field of Classification Search
USPC .......................................................... 368/69
See application file for complete search history.

(56) References Cited

U.S. PATENT DOCUMENTS

| | | | |
|---|---|---|---|
| 8,301,211 B2* | 10/2012 | Lee ................. | H04M 1/274525 340/539.11 |
| 2003/0151982 A1* | 8/2003 | Brewer ................. | G04G 21/00 368/46 |
| 2008/0162996 A1* | 7/2008 | Krah ..................... | G06F 1/3203 714/27 |
| 2010/0253639 A1 | 10/2010 | Huang et al. | |
| 2011/0080349 A1 | 4/2011 | Holbein et al. | |
| 2013/0082941 A1 | 4/2013 | Huang et al. | |

* cited by examiner

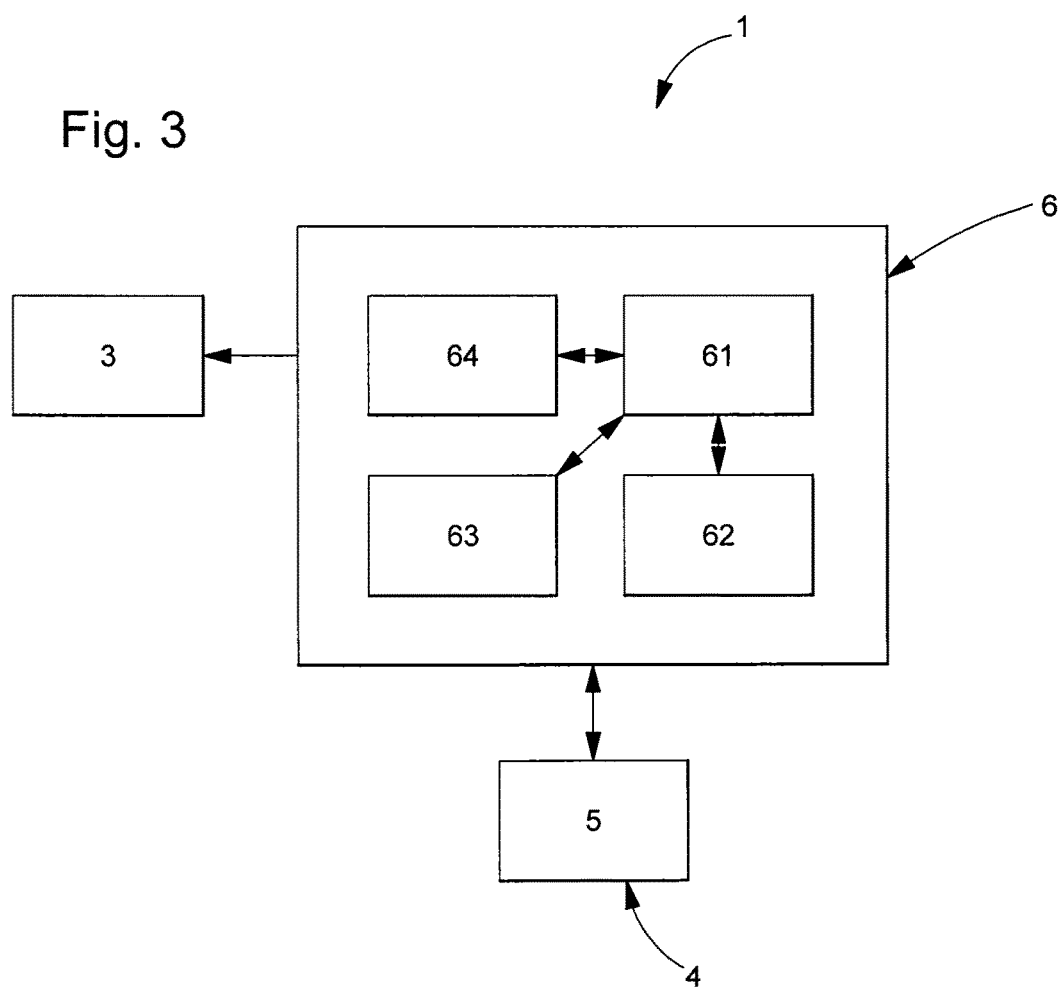

METHOD FOR MANAGING OPERATIONS ON AN ELECTRONIC DEVICE

CROSS-REFERENCE TO RELATED APPLICATIONS

This is a National phase application in the United States of International patent application PCT/EP2014/057772 filed Apr. 16, 2014 which claims priority on European patent application No. 13164968.3 filed Apr. 23, 2013. The entire disclosures of the above patent applications are hereby incorporated by reference.

The invention concerns an electronic device including a case comprising a glass and a back cover, said electronic device including at least one electronic module arranged to be able to execute several functions and to provide information relating to these functions to display means disposed underneath the glass and control means including at least two contact areas which the user can press to act on said at least one electronic device.

BACKGROUND OF THE INVENTION

There are known electronic devices including a LCD touch screen used to activate the various functions of the device.

For example, there are known watches including a so-called touch glass having, on the lower face thereof, capacitive electrodes acting as touch keys. These keys are activated by a conventional push-piece. This activation of the touch keys consists in scanning them. This means that each key is monitored at a certain frequency to see whether there is a depression, i.e. a capacitance variation. A high scanning frequency on the order of 64 Hz is used to detect the different depressions and different touch operations. The user then touches the location of a capacitive electrode to activate the desired function.

One drawback of this method is that the user must pre-activate the touch keys before selecting a function and this therefore requires an additional operation. Further, this configuration requires a key to activate a function, which consequently limits the number of functions that the device can have.

There are also known electronic devices provided with a touch screen. This touch screen is permanently activated so that, at any time, the user can operate the electronic touch device. This means that all of the touch keys are scanned at a high frequency. Although this is convenient for the user during operations, this configuration also has the drawback of being energy intensive. Indeed, this permanent scanning requires continuous use of the microprocessor or microcontroller which controls the touch display. This results in high electrical power consumption.

SUMMARY OF THE INVENTION

It is an object of the invention to overcome the drawbacks of the prior art by proposing to provide an electronic device which offers good comfort of use but remains electrical energy efficient.

To this end, the invention concerns an electronic device including a case provided with a glass and a back cover, said electronic device including at least one electronic module arranged to calculate the current time, to execute several functions and to provide information relating to the current time and to these functions to display means disposed underneath the glass, the electronic device including control means comprising at least one contact area allowing the user to act on said at least one electronic module, this at least one contact area being monitored by the electronic module at a scanning frequency, characterized in that the electronic module is arranged to operate in a first operating mode, in which the current time is displayed and in which the at least one contact area is monitored at a first scanning frequency, and to operate in a second operating mode, in which the functions can be activated by the user and in which the at least one contact area is monitored at a second scanning frequency higher than the first scanning frequency.

In a first advantageous embodiment, the control means include at least two contact areas.

In a second advantageous embodiment, the change from the first operating mode to the second operating mode is achieved by a contact on at least one contact area.

In a third advantageous embodiment, the control means include three contact areas.

In a fourth advantageous embodiment, the change from the first operating mode to the second operating mode is achieved by detecting a contact on two of the at least two contact areas.

In another advantageous embodiment, the first scanning frequency is comprised in a range from 1 Hz to 6 Hz.

In another advantageous embodiment, the first scanning frequency is 2 Hz.

In another advantageous embodiment, the second scanning frequency is comprised in a range from 30 Hz to 100 Hz.

In another advantageous embodiment, the second scanning frequency is 64 Hz.

In another advantageous embodiment, said device is a watch.

BRIEF DESCRIPTION OF THE DRAWINGS

The objects, advantages and features of the electronic apparatus according to the present invention will appear more clearly in the following detailed description of at least one embodiment of the invention, given solely by way of non-limiting example and illustrated by the annexed drawings, in which:

FIG. 3 is a schematic view of an electronic device according to the invention.

DETAILED DESCRIPTION

Figure 1:
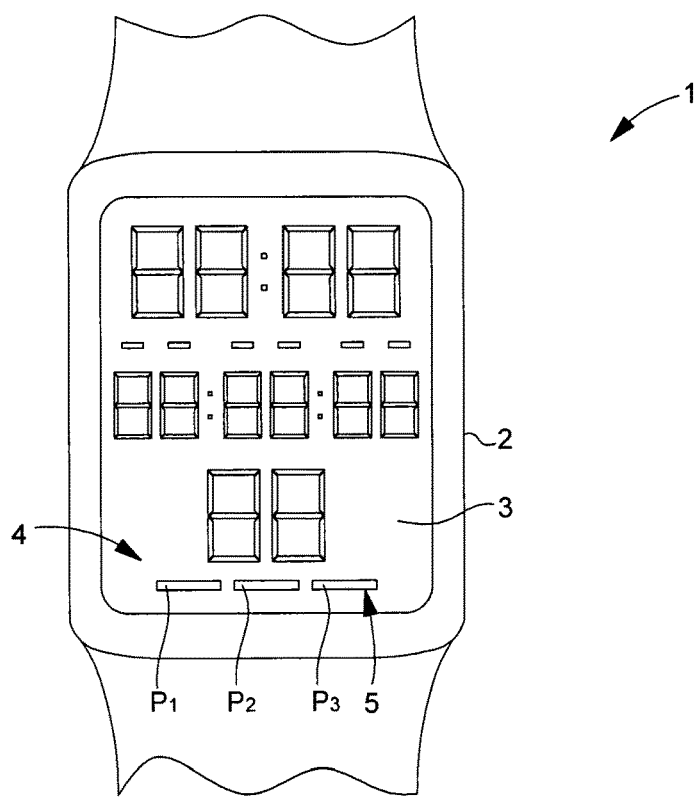
FIG. 1 shows a top view of the electronic device according to the invention.

FIGS. 1 and 3 show a portable object 1 according to the invention. This portable object is an electronic device which may be a watch or a telephone or a computer or a touch tablet or any other touch device. This device includes a case 2 provided with a glass and a back cover. The electronic device further includes at least one electronic module 6. This electronic module 6 is arranged to execute several functions and to provide information relating to these functions to display means 3 disposed underneath the glass. Electronic module 6 may include a microcontroller 61 cooperating with a time base 62, a memory 64 and various sensors 63 to provide time, pressure and temperature related information.

In a watch, electronic module 6 is arranged, in a normal operating mode, to display the current time. In an additional operating mode, the electronic module is arranged to execute one of the available functions, with the user selecting the desired function.

Control means 4 are arranged to control said electronic device. These control means 4 are arranged on the glass or in case 2. Control means 4 are touch control means 5, i.e. they react to actions of the user's fingers. These touch control means 5 are capacitive, i.e. an electrode is placed underneath the glass or under case 2. The contact of the user's finger on the glass or case 2 at the electrode location causes a variation in capacitance. This variation in capacitance is detected and interpreted by the electronic module.

In the portable object according to the invention, control means 5 include at least one contact area P1, also called a touch key, with which the user enters into contact in order to act on said at least one electronic device. Preferably, the control means include at least two contact areas and even more preferably three contact areas P1, P2 and P3.

Advantageously, the invention provides that the use of touch control means 5 is convenient for the user and electrically efficient.

Figure 2:
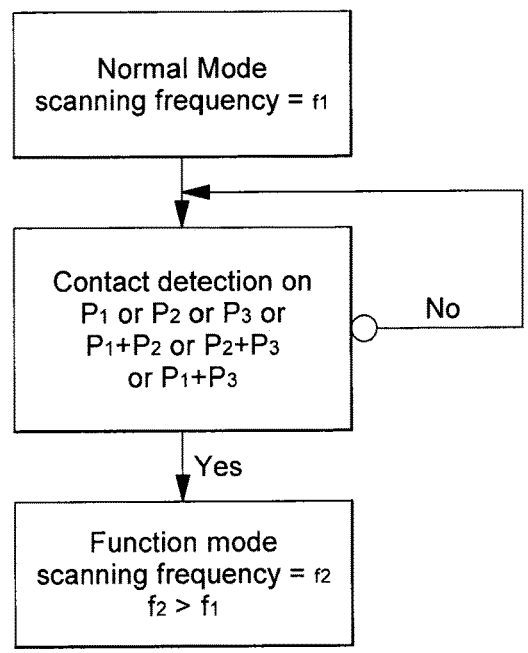
FIG. 2 is a step diagram of the control of the electronic device according to the invention.

To achieve this, electronic module 6 is arranged to operate in two different operating modes as seen in FIG. 2. Electronic module 6 is arranged to operate in a first, so-called normal operating mode in which the current time is displayed and in a second, so-called function operating mode, in which the user can activate the various functions of the device.

In the first operating mode, electronic module 6 scans the touch keys at a first frequency f1. Preferably, this frequency is selected to be in a range from 1 to 6 Hz. Preferably, a frequency of 2 Hz is selected. This frequency is low and consequently uses very little electrical energy.

In this first operating mode, the only active function is the current time function, so that no other function can be selected and activated. Thus, no complex operation on the touch keys is required. This first frequency f1 is thus used for the change from the first operating mode to the second operating mode.

To change to the second operating mode, only a contact on at least one of the touch keys must be detected. This contact can be a tap or a light touch. Since only a single contact is needed, this does not require a high scanning frequency and a low scanning frequency is sufficient to detect such a contact. It is understood that when there is a contact with one or two touch keys, electronic module 6 detects this contact and starts the change from the first operating mode to the second operating mode.

The second operating mode for activating the other functions of the electronic device is characterized by a second scanning frequency f2. This second scanning frequency f2 is selected to be higher than the first scanning frequency f1, which is the scanning frequency of the first operating mode.

Preferably, this second scanning frequency f2 is selected to be in a range from 30 to 100 Hz and preferably this frequency is 64 Hz.

This second scanning frequency f2 is high since it has to allow complex operations such as detecting a finger activating the different touch keys one after the other or rapid depressions.

Indeed, during a complex operation such as the successive activation of different keys, also known as "sliding", there is a shorter time interval between two contacts on the touch keys by the user's fingers. Consequently, detection of the depression must be reliable. Increasing the scanning frequency reduces the time between two capacitance monitoring checks of a touch key. This reduced time between two monitoring checks results in easier detection of rapid depressions while decreasing the risk of errors.

Consequently, the electronic module optimises electrical power consumption and user comfort by providing a permanently activated display screen while limiting electrical power consumption.

It will be clear that various alterations and/or improvements and/or combinations evident to those skilled in the art may be made to the various embodiments of the invention set out above without departing from the scope of the invention defined by the annexed claims.

The invention claimed is:

1. An electronic device comprising:
   a case including a glass and aback cover;
   at least one electronic module configured to calculate a current time, to execute plural functions, and to provide information relating to the current time and to the functions to a display disposed underneath the glass; and
   a touch controller that is capacitive and including at least one contact area allowing a user to act on the at least one electronic module, the at least one contact area being monitored by the electronic module at a scanning frequency; wherein
   the electronic module is configured to operate in a first operating mode that is a time display mode, in which the current time is displayed and in which the touch controller is activated and a capacitance at the at least one contact area is monitored at a first scanning frequency for an entire duration of the first operating mode, the first scanning frequency being non-zero, and to operate in a second operating mode that is an expanded functions mode, in which the functions not activatable in the time display mode are activatable by the user and in which the touch controller is activated and the capacitance at the at least one contact area is monitored at a second scanning frequency higher than the first scanning frequency for an entire duration of the second operating mode, and
   the electronic module is configured to change from monitoring the capacitance at the at least one contact area at the first scanning frequency to monitoring the capacitance at the at least one contact area at the second scanning frequency by detecting a variation of the capacitance at the at least one contact area using the first scanning frequency while the electronic module is in the first operating mode.

2. The electronic device according to claim 1, wherein the touch controller includes at least two contact areas.

3. The electronic device according to claim 2, wherein a change from the first operating mode to the second operating mode is achieved by a contact on at least one of the at least two contact areas.

4. The electronic device according to claim 2, wherein a change from the first operating mode to the second operating mode is achieved by detecting a contact on two of the at least two contact areas.

5. The electronic device according to claim 1, wherein a change from the first operating mode to the second operating mode is achieved by a contact on the at least one contact area.

6. The electronic device according to claim 1, wherein the touch controller includes three contact areas.

7. The electronic device according to claim 1, wherein the first scanning frequency is in a range from 1 Hz to 6 Hz.

8. The electronic device according to claim 7, wherein the first scanning frequency is 2 Hz.

9. The electronic device according to claim 1, wherein the second scanning frequency is in a range from 30 Hz to 100 Hz.

10. The electronic device according to claim 9, wherein the second scanning frequency is 64 Hz.

11. The electronic device according to claim 1, wherein the electronic device is a watch.

12. The electronic device according to claim 1, wherein in the first operating mode, the electronic module is configured to operate so that display of the current time is an only active function.

13. The electronic device according to claim 12, wherein in the first operating mode, the electronic module is configured to operate so that no other function is activatable.

14. The electronic device according to claim 1, wherein the electronic module is configured to monitor the capacitance at the at least one contact area constantly at the first scanning frequency in the first operating mode, and to monitor the capacitance at the at least one contact area constantly at the second scanning frequency in the second operating mode.

15. An electronic device comprising:
a case including a glass and a back cover; and
circuitry configured to calculate a current time, to execute plural functions, and to provide information relating to the current time and to the functions to a display disposed underneath the glass,
the circuitry including a touch controller that is capacitive and that includes at least one contact area allowing a user to act on the circuitry, the at least one contact area being monitored by the circuitry at a scanning frequency,
the circuitry is configured to operate in a first operating mode that is a time display mode, in which the current time is displayed and in which the touch controller is activated and a capacitance at the at least one contact area is monitored at a first scanning frequency for an entire duration of the first operating mode, the first scanning frequency being non-zero, and to operate in a second operating mode that is an expanded functions mode, in which the functions not activatable in the time display mode are activatable by the user and in which the touch controller is activated and the capacitance at the at least one contact area is monitored at a second scanning frequency higher than the first scanning frequency for an entire duration of the second operating mode, and
the circuitry is configured to change from monitoring the capacitance at the at least one contact area at the first scanning frequency to monitoring the capacitance at the at least one contact area at the second scanning frequency by detecting a variation of the capacitance at the at least one contact area using the first scanning frequency while the circuitry is in the first operating mode.

16. The electronic device according to claim 15, wherein the circuitry is configured to monitor the capacitance at the at least one contact area constantly at the first scanning frequency in the first operating mode, and to monitor the capacitance at the at least one contact area constantly at the second scanning frequency in the second operating mode.

* * * * *